United States Patent [19]

De Luca et al.

[11] Patent Number: 4,590,335
[45] Date of Patent: May 20, 1986

[54] TEST SHOE FOR TELEPHONE CONNECTOR BLOCKS HAVING MODULE RETRACTION MEANS

[75] Inventors: Paul V. De Luca, Plandome Manor; Peter Hung, Huntington, both of N.Y.

[73] Assignee: Porta Systems Corp., Syosset, N.Y.

[21] Appl. No.: 665,459

[22] Filed: Oct. 26, 1984

[51] Int. Cl.⁴ .................... H01R 13/629; H04M 1/24
[52] U.S. Cl. .............................. 179/175; 179/175.1 R; 179/178
[58] Field of Search ................ 179/175.1 R, 175, 186, 179/189; 324/158 F; 292/53, 56, 221

[56] References Cited

U.S. PATENT DOCUMENTS 4,386,243 5/1983 De Luca et al. ............. 179/175.1 R

Primary Examiner—Stafford D. Schreyer
Attorney, Agent, or Firm—Charles E. Temko

[57] ABSTRACT

A multi-circuit test shoe adapted to be fitted over a telephone circuit connector block having individual subscriber circuit protector modules thereon, the shoe having means for selectively lifting said modules on an individual basis from fully engaged to detent positions on said blocks.

5 Claims, 5 Drawing Figures

TEST SHOE FOR TELEPHONE CONNECTOR BLOCKS HAVING MODULE RETRACTION MEANS

BACKGROUND OF THE INVENTION

This invention relates generally to the field of telephony, and more particularly to an improved form of test shoe used by service personnel to determine the existence of defects in individual subscriber circuits. Devices of this general type are known in the art, and the invention lies in specific constructional details which permit the use of the shoe in connection with specialized equipment employed by telephone operating companies.

Individual subscriber circuits are normally interfaced for protection and switching upon a connector block, the block being one of many carried by an individual telephone main frame. It is desirable to have the individual subscriber circuits available for testing at the main frame location, and for this purpose many connector blocks have an adjacent test field offering test points accessible to manually engaged probes. To save valuable space on the main frame, more recently developed connector blocks have provision for mounting protector modules, one for each circuit which serve the purpose, not only of protecting the telephone office equipment from current and voltage surges on the subscriber line but of disconnecting the subscriber line, where required, by partially withdrawing the module to a so-called detent position, wherein it remains engaged with the connector block, but opens the subscriber circuit.

In an attempt to provide greater available subscriber line density on the block, it has also become common to eliminate the field, and provide test points on the outer surface of the protector module casing on either side of the manually engagable handle. The test points are accessed as a group by engagement with a test shoe having recesses in an oprative face thereof to clear the handles on the modules, as well as spring loaded pins which penetrate the openings in the outer end walls of the casing to contact test points positioned therebeneath. The shoe is normally clamped to the block to permit a group of subscriber circuits to be tested in serial form, and when a test cycle is completed, the shoe is removed to be repositioned with respect to the block for the subsequent testing of other subscriber circuits on that block.

Individual telephone operating companies use test equipment of different types and capacities. Some of the equipment provides testing functions which require the opening of the subscriber circuit during the testing procedure, and in such cases, it is necessary to close the circuit after completion of testing in order to restore service to the subscriber. The opening of the circuits is most conveniently done by moving the protector module from fully engaged to detent position as mentioned hereinabove. However, when the conventional test shoe is locked in position on the block, the handle members of the individual protector modules are not accessible. Further, the conventional test shoe does not have recesses in the operative face thereof to accomodate protector modules in detented (or extended) position, so that to open the subscriber circuits, it is necessary to remove the test shoe from engagement with the block. Once this is done, the test can no longer be performed using the test shoe as an interface device.

SUMMARY OF THE INVENTION

Briefly stated, the invention contemplates the provision of an improved telephone circuit test shoe of the type described in which provision has been incorporated for the retraction of individual protector modules during the period in which the shoe is in engaged condition upon a connector block. Once moved to detent position, the required testing procedure using an open subscriber circuit may be performed, following which the protector modules are returned to fully seated position for resumption of subscriber service or further testing procedure requiring a closed circuit. To accomplish this end, each module accommodating recess in the test shoe is provided with an elongated jack element capable of both longitudinal and axial motion within the shoe. An outer end thereof is provided with manually engagable means having position indicating indicia thereupon. An inner end thereof is provided with a laterally extending terminal capable of selectively engaging the handle member on the outer end of the protector module casing to permit movement in either of two oppositely disposed directions. A coil spring interconnecting the jack element with the test shoe housing resiliently urges the jack element in an outward direction and rotationally to a disengaged condition relative to the handle element, so as not to interfere with normal engagement and disengagement of the shoe with the connector block.

BRIEF DESCRIPTION OF THE DRAWING

In the drawing, to which reference will be made in the specification, similar reference characters have been employed to designate corresponding parts throughout the several views.

DETAILED DESCRIPTION OF THE DISCLOSED EMBODIMENT

Figure 1:
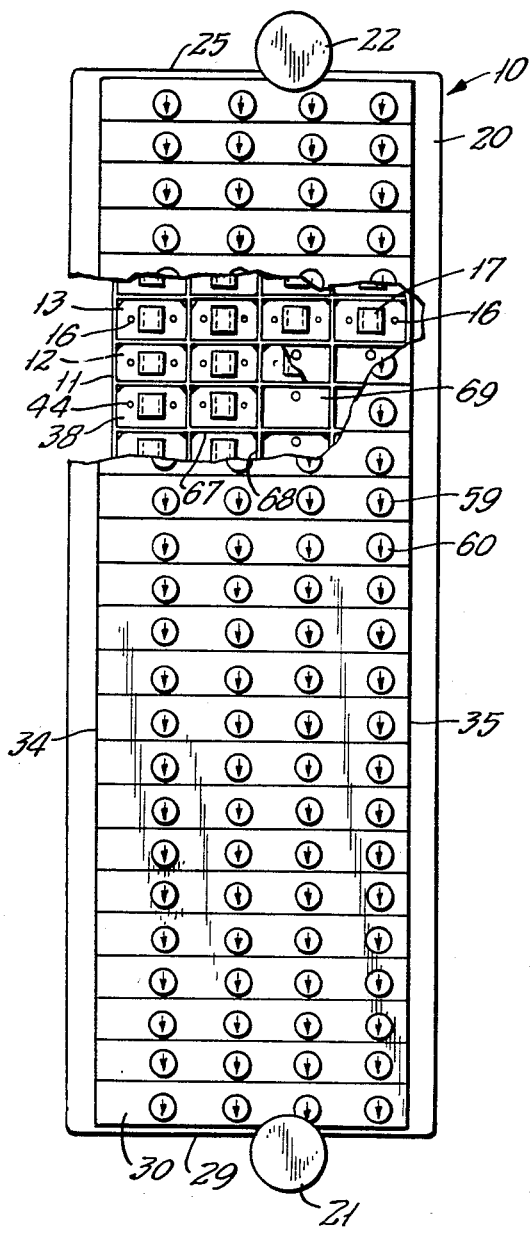
FIG. 1 is a front elevational view of an embodiment of the invention in engaged condition upon a known subscriber circuit connector block.
Figure 3:
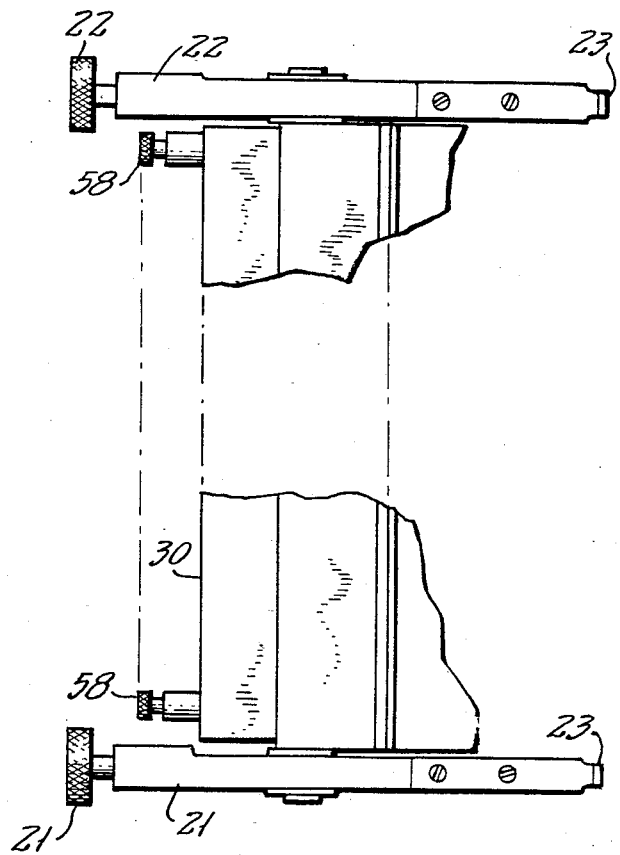
FIG. 3 is a fragmentary top plan view thereof.
Figures 4, 5:
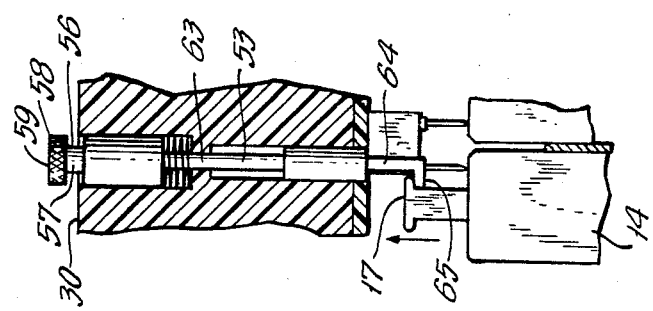
FIG. 4 is a fragmentary sectional view thereof corresponding to that seen in FIG. 2, showing certain of the component parts in altered relative position.
FIG. 5 is a fragmentary sectional view corresponding to that seen in FIG. 4, showing further altered relative positions.
Figure 2:
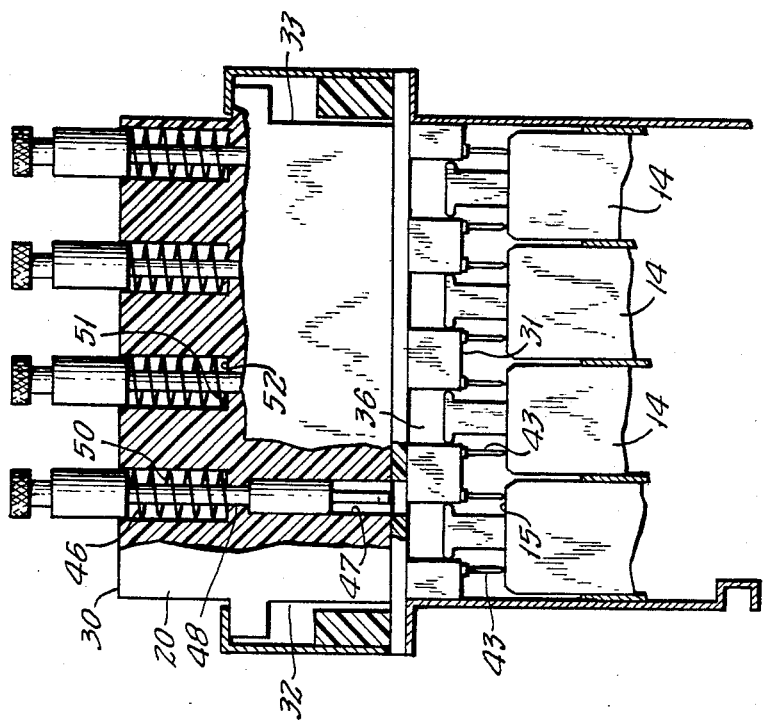
FIG. 2 is a transverse sectional view thereof as seen from the plane 2—2 in FIG. 1, but showing the embodiment in disconnected condition relative to the connector block.

In accordance with the invention, and with reference to FIG. 1, reference character 11 designates a known telephone subscriber circuit connector block, one surface 12 of which defines a plurality of rectangularly-shaped recesses 13, each accommodating a known protector module 14. The modules 14 are of a type in which an outwardly disposed surface 15 has test points 16 and a small handle member 17 which is normally manually engagable for removal of the module from engagement with the block, or to move the module from fully engaged position to so-called detent position in which the subscriber circuit is opened, but the module remains supported on the block.

The device 10 is selectively interconnectable with individual areas on the block 11 to test a plurality of circuits in serial fashion. Most conveniently, the block may be configured to test a sub-multiple of the total number of circuits on the block, so that by repositioning the shoe several times, all of the circuits on the block may be accessed. The device 10 include a main body element 20 preferably formed as a single molding from synthetic resinous material which is engaged on the block 11 by left and right-hand clamp elements 21 and 22, respectively, of known type. The elements 21-22 are provided with hooked inner ends 23 which engaged longitudinal edge surfaces 24 and 25 of the block 11.

The main body element 20 is bounded by an outer surface 30, an inner surface 31, end surfaces 32 and 33, and side surfaces 34 and 35. The inner surface 31 is provided with recesses 36 accommodating the exposed ends of protector modules 14 in well known fashion. In the case of the present device, the recesses 36 are considerably deeper than in corresponding prior art devices, to permit the device 10 to remain mounted upon the block 11 when the modules 14 have been retracted to detent position.

Projecting from the inner surface 31 are a plurality of resiliently urged pins 43 positioned to engage the test points 16 on individual modules which are positioned beneath openings 44 in the outer wall 38 of each module. As the construction of these pins are well known in the art, the details of the same need not be further considered herein.

Extending between the inner and outer surfaces 30-31 are a plurality of outer bores 46, inner bores 47 and connecting counterbores 48, which are positioned to overlie each recess 13 in an area adjacent one corner thereof. Positioned within the outer bores 46 are axially compressible torsion springs 50, an inner end 51 of each contacting a transverse wall 52 of the bore 46. The bores 46-48 each accommodate an elongated jack element 53 including an outer shaft 56 an outer end 57 of which projects outwardly of the body element 20 and mounts a manually engagable knob 58. An outer surface 59 thereof is provided with indicia means 60, the purpose of which will become more fully apparent hereinafter.

The shaft 56 includes a sleeve member which slidably rides in the outer bore 46, while a thinner medial portion 63 rides in the counterbore 48. An inner end portion 64 moves with substantial clearance within the inner bore 47, and is provided with a laterally extending terminal 65 adapted to move beneath and above the transverse portion of the handle member 17 with rotation of the manually engagable member 58 through approximately 90° so as to lie parallel to the side 67 and end 68 walls of a single subscriber area 69 which accommodates a single module 37.

Operation of the device will be apparent from a consideration of the drawing. Initially, the device 10 is positioned to overlie a specific area on the connector block wherein the associated modules 14 are positioned beneath the device, and the resilient pins 43 contact the test points on each module, following which telephone test equipment may send the necessary signals to the individual subscriber line to perform a series of tests. Should some lines indicate the necessity of further testing with the subscriber circuit open, these are noted by service personnel, so that at the conclusion of testing of those circuits which do not require further open circuit testing, the jack elements related to the selected circuits may be activated to withdraw the associated modules to detent position. Because of the presence of the springs 50, the jack element will normally be outwardly positioned and with the laterally extending terminal 65 parallel to an end wall 68 which encloses the subscriber area 69.

The operator then pushes downwardly on the manually engagable member 58 to move the jack element inwardly to the end of its path of travel. Next the manually engagable member 58 is turned clockwise as seen in the drawing through 90° which will result in bringing the terminal beneath the undercut portion of the handle member 39 of the module. Thus, the terminal will be parallel to the side wall 67 of the area 69. The module may then be withdrawn to detent position by pulling outwardly until the detent position is sensed. The remaining circuits which require open circuit testing may receive a similar procedure, following which the open circuits tests are performed. If no further testing is required, the device 10 may be removed. However, it is possible to return the modules to fully engaged condition by rotating the jack elements as above while they are at their outward most limit of travel which will result in positioning the laterally extending projections adjacent the outer surface of the handle member 17, so that a subsequent inward pressing movement will return the module to fully seated position.

We wish it to be understood that we do not consider the invention limited to the precise details of structure shown and set forth in this specification, for obvious modifications will occur to those skilled in the art to which the invention pertains.

We claim:

1. In an improved test shoe for testing individual telephone subscriber circuits interfaced at a telephone protector block, said block having recesses mounting individual protector modules for each subscriber circuit, said modules having test points on an outer surface thereof accessible to corresponding resiliently mounted pins on said shoe, said modules having a handle member thereon disposed between said test points, said modules being longitudinally removable between fully engaged and detent positions, the improvement comprising: said test shoe having a plurality of slidably mounted jack elements each positioned to overlie an end surface of a protector module in an area adjacent the handle member thereof; said jack elements having manually engagable means on an outer end thereof, and means on an inner end thereof selectively engagable with the handle member of an underlying protector module for the transmission of axially directed motion thereto; whereby, said jack elements may selectively move an underlying protector module between said fully engaged and detent positions without the necessity of first removing said test shoe from engagement with said lock.

2. The improvement in accordance with claim 1, further characterized in said jack elements each including an elongated shaft, an outer end of which projects outwardly of said test shoe for transmitting manually imparted axial and rotational movement, said shaft having a laterally extending terminal on an inner end thereof selectively rotationally positioned beneath and above a corresponding handle member.

3. The improvements in accordance with claim 2, further comprising an axially compressible spring surrounding a medial portion of said jack elements and serving to resiliently urge said inner terminal out of engagement with a handle member on a protector module disposed therebeneath, and toward an outwardly positioned limit of travel of said jack elements.

4. The improvement set forth in claim 3 said outer end of elongated shaft having indicia means thereon for indicating the rotational position of said inner terminal.

5. The improvement set forth in claim 4, said inner terminals being of configuration such that they are clear of said test points on said protector module in all relative positions.

* * * * *